US007524615B2

(12) United States Patent
Teng

(10) Patent No.: US 7,524,615 B2
(45) **Date of Patent: *Apr. 28, 2009**

(54) NEGATIVE LASER SENSITIVE LITHOGRAPHIC PRINTING PLATE HAVING SPECIFIC PHOTOSENSITIVE COMPOSITION

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 51 days.

This patent is subject to a terminal disclaimer.

(21) Appl. No.: 11/651,319

(22) Filed: Jan. 9, 2007

(65) Prior Publication Data

US 2008/0038668 A1 Feb. 14, 2008

Related U.S. Application Data

(63) Continuation-in-part of application No. 11/504,565, filed on Aug. 14, 2006, now abandoned.

(51) Int. Cl.
*G03C 5/18* (2006.01)
*G03F 7/00* (2006.01)

(52) U.S. Cl. ........................ 430/302; 430/300; 430/435

(58) Field of Classification Search .............. 430/270.1, 430/273.1, 300, 302, 435
See application file for complete search history.

(56) References Cited

U.S. PATENT DOCUMENTS

| | | | | |
|---|---|---|---|---|
| 4,198,242 | A * | 4/1980 | Pazos | 430/286.1 |
| 6,423,471 | B1 * | 7/2002 | Sorori et al. | 430/281.1 |
| 6,541,176 | B2 | 4/2003 | Miyazaki et al. | 430/204 |
| 6,689,537 | B2 | 2/2004 | Urano et al. | 430/273.1 |
| 6,749,995 | B2 | 6/2004 | Matsumura | 430/281.1 |
| 6,841,336 | B2 | 1/2005 | Kondo | 430/302 |
| 7,011,928 | B2 | 3/2006 | Takamuki | 430/302 |
| 7,041,429 | B2 | 5/2006 | Ohta et al. | 430/270.1 |
| 7,348,131 | B2 * | 3/2008 | Teng | 430/302 |
| 7,348,132 | B2 * | 3/2008 | Teng | 430/302 |
| 2003/0073012 | A1 * | 4/2003 | Fiebag | 430/18 |
| 2003/0186165 | A1 | 10/2003 | Gries et al. | 430/281.1 |
| 2004/0013968 | A1 * | 1/2004 | Teng | 430/270.1 |
| 2004/0157153 | A1 | 8/2004 | Takamuki | 430/270.1 |
| 2005/0005794 | A1 | 1/2005 | Inukai et al. | 101/453 |
| 2005/0158663 | A1 * | 7/2005 | Tabuchi et al. | 430/300 |
| 2005/0204945 | A1 | 9/2005 | Sonokawa | 101/463.1 |
| 2005/0227180 | A1 | 10/2005 | Matsuoka et al. | 430/300 |
| 2005/0266349 | A1 | 12/2005 | Van Damme et al. | 430/300 |
| 2006/0024614 | A1 | 2/2006 | Williamson | 430/270.1 |
| 2006/0046191 | A1 | 3/2006 | Sakata | 430/270.1 |
| 2007/0202434 | A1 * | 8/2007 | Arias et al. | 430/270.1 |
| 2008/0145789 | A1 * | 6/2008 | Knight | 430/300 |

OTHER PUBLICATIONS

Džunuzović, Enis et al., Dynamical Mechanical Analysis of Photocrosslinked Hyperbranched Urethane Acrylates, Journal of the Serbian Chemical Society, Dec. 17, 2003, (abstract).*

Dzunuzovic,Enis et al., Dynamical Mechanical Analysis of Photocrosslinked Hyperbranched Urethane Acrylates, Journal of the Serbian Chemical Society, Dec. 17, 2003, (abstract).*

* cited by examiner

*Primary Examiner*—Cynthia H Kelly
*Assistant Examiner*—Chanceity N Robinson

(57) ABSTRACT

High speed violet or ultraviolet laser sensitive lithographic printing plate comprising on a hydrophilic substrate a specific photosensitive composition is described. The photosensitive layer comprises an alkaline soluble polymeric binder, a multifunctional (meth)acrylate monomer, a free-radical initiator, and a sensitizing dye. The plate is imagewise exposed with a violet or ultraviolet laser at a dosage of less than 300 μJ/cm$^2$, and then developed with an aqueous alkaline developer. Higher monomer to polymer weight ratio is advantageously used. A pigment is preferably incorporated into the photosensitive coating solution as a liquid dispersion. The exposed plate is preferably developed on a processor with an alkaline developer coupled with a replenisher having higher pH.

31 Claims, No Drawings

NEGATIVE LASER SENSITIVE LITHOGRAPHIC PRINTING PLATE HAVING SPECIFIC PHOTOSENSITIVE COMPOSITION

RELATED PATENT APPLICATIONS

This application is a continuation-in-part application of U.S. patent application Ser. No. 11/504,565 filed Aug. 14, 2006 now abondoned.

FIELD OF THE INVENTION

This invention relates to lithographic printing plates. More particularly, it relates to lithographic printing plates having a photosensitive layer comprising a polymeric binder, a multifunctional (meth)acrylate monomer, a free radical initiator, and a sensitizing dye at specific composition, suitable for imagewsie exposure with a violet or ultraviolet laser, and methods of processing such plates.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate.

Laser sources have been increasingly used to imagewise expose a lithographic printing plate that is sensitized to a corresponding laser. This allows the elimination of the photomask film, reducing material, equipment and labor cost. Among the lasers useful are infrared lasers (about 830 nm or 1064 nm), FD-YAG laser (about 532 nm), violet laser (about 405 nm), and ultraviolet laser (such as about 375 nm). Violet and ultraviolet laser sensitive plates are quite attractive because of their yellow light handling capability (in contrast to red light handling for FD-YAG sensitive plate) and higher quantum efficiency (than infrared laser sensitive plate). However, the energy output of a violet or ultraviolet laser diode is much lower than that of an infrared laser diode. In order to be imaged with a violet or ultraviolet laser imager at a practical speed, a violet or ultraviolet laser sensitive plate should have a sensitivity of preferably less than 300 $\mu J/cm^2$, more preferably less than 200 $\mu J/cm^2$, and most preferably less than 100 $\mu J/cm^2$, which is significantly lower than the sensitivity required for an infrared laser sensitive plate (typically 50 to 300 $mJ/cm^2$) or a conventional plate exposed with an ultraviolet lamp through a photomask (typically 50 to 300 $mJ/cm^2$).

Silver halide based violet laser sensitive plate has recently been introduced as the first lithographic printing plate suitable for imaging with violet laser, utilizing the inherently high sensitivity of silver halide. Examples include U.S. Pat. No. 6,541,176. However silver halide based plates have the disadvantages of relatively low run length and generating hazardous silver waste.

Photopolymerizable composition based (also called photopolymer) violet or ultraviolet laser sensitive plates are very attractive because of the high durability of photopolymer plates. However, because of the extremely high sensitivity requirement of the violet or ultraviolet laser sensitive plate, a commercially viable violet or ultraviolet laser sensitive photopolymer plate can not be achieved by simple addition of a laser absorbing sensitizer into a conventional photopolymer plate but will require certain specific photopolymerizable composition. The selection of the monomer, polymer, and intiator is crucial in achieving a commercially viable violet or ultraviolet laser sensitive photopolymer plate.

U.S. Pat. No. 6,689,537 (Urano et al) describes some specific compositions for violet photopolymer plate, wherein the photosensitive layer comprises multifunctional (with 3 or more functional groups) urethane acrylate monomers, difunctional non-urethane acrylate monomers, a polymeric binder and a hexaarylbiimidazole compound, and the weight ratio of the multifunctional monomers to the polymeric binders is less than 0.75.

U.S. Pat. No. 6,423,471 (Sorori et al) describes some specific compositions for violet photopolymer plate, wherein the photosensitive layer comprises a monomer and a polymeric binder at a weight ratio of 0.75, with a titanocene compound as the free radical initiator.

U.S. Pat. No. 6,841,336 (Kondo) describes some specific compositions for violet photopolymer plate, wherein the photosensitive layer comprises a multifunctional monomer and a polymeric binder at a weight ratio of 0.75, with a titanocene compound as the free radical initiator.

U.S. Pat. App. No. 2006/0046191 (Sataka) describes some specific compositions for violet photopolymer plate, wherein the photosensitive layer comprises a multifunctional monomer and a polymeric binder at a weight ratio of 1.0, with a titanocene compound as the free radical initiator.

U.S. Pat. No. 6,749,995 (Matsumura) describes some specific compositions for violet photopolymer plate, wherein the photosensitive layer comprises polyfunctional urethane acrylate monomers, trifunctionality non-urethane acrylate monomer and polymeric binder; the weight ratio of the multifunctional monomers to the polymeric binders is 1.0, and the weight ratio of the polyfunctional urethane acrylate monomer to the polymeric binder is 0.25. A specific phosphorus-containing compound, a specific nitrogen-containing compound, or a titanocene compound is used as the free radical initiator.

U.S. Pat. No. 7,011,928 (Takamuki) describes some specific compositions for violet photopolymer plate, wherein the photosensitive layer comprises a monofunctional acrylate monomer, a difunctional methacrylate monomer, a multifunctional urethane (meth)acrylate monomer, and a polymeric binder, with a borate salt as the free radical initiator; the weight ratio of the multifunctional urethane monomer to the polymeric binder is 0.625.

U.S. Pat. No. 7,041,429 (Ohta, et al) describes some specific compositions for violet photopolymer plate, wherein the photosensitive layer comprises a difunctional methacrylate monomer, a multifunctional urethane methacrylate monomer, and a polymeric binder; the weight ratio of the monomers to the polymeric binder is 1.0 and the weight ratio of the multifunctional (meth)acrylate monomer to the polymeric binder is 0.625. A trihalomethyl group-containing oxadiazole compound, with or without addition of a titanocene, monoalkyltriaryl borate, or iron arene complex compound, is used as the free radical initiator.

U.S. Pat. App. Pub. No. 2003/0186165 (Gries et al) describes some specific compositions for violet photopolymer plate, wherein the photosensitive layer comprises difunctional (meth)acrylate monomer and a polymeric binder at a weight ratio of about 1.6 to 2.4, with a hexaarylbiimidzole compound as the free radical initiator; while photosensitive layers having a trifunctional non-urethane monomer and a polymeric binder at a weight ratio of about 1.63 or having a penta functional non-urethane acrylate monomer and a polymeric binder at a weight ratio of about 1.50 are also described in the patent application as comparative examples, such photosensitive layers were reported in the patent application to give no hardening upon exposure to the violet laser.

U.S. Pat. App. Pub. No. 2006/0024614 (Williamson) describes some specific compositions for violet photopolymer plate, wherein the photosensitive layer comprises a difunctional (meth)acrylate monomer and a polymeric binder, with a hexaarylbiimidzole compound as the free radical initiator; no specific photosensitive composition containing multifunctional (meth)acrylate monomer was disclosed.

While multifunctional monomers and higher content of the total monomers in an aqueous alkaline developable violet plate are described in the patents, there is no teaching of higher weight ratio of the multifunctional monomers to the polymeric binders for such plate. Apparently, higher content of the multifunctional monomer might be thought to cause difficulty in development with aqueous alkaline developer, since multifunctional monomers are generally larger in size and less soluble or dispersible in aqueous developer than monofunctional or difunctional monomers.

The inventor has found, surprisingly, violet or ultraviolet laser sensitive lithographic printing plates having, between a hydrophilic substrate and a water soluble or dispersible overcoat, a photosensitive layer comprising multifunctional (meth)acrylate monomer and polymeric binder at higher weight ratio can be developed with an aqueous alkaline developer and give significantly better photospeed and press durability than plate with lower monomer-to-polymer weight ratio or with lower monomer functionality. In addition, the process conditions for developing the plate and for preparing the photosensitive coating fluid have also been found to be important in achieving good performance for the specific violet or ultraviolet laser sensitive photopolymer plates.

SUMMARY OF THE INVENTION

According to the present invention, there has been provided a method of processing a lithographic printing plate comprising in order:

(a) providing a lithographic printing plate comprising (i) a hydrophilic substrate, (ii) an oleophilic photosensitive layer comprising an alkaline soluble polymeric binder, a monomer having at least 3 (meth)acrylate groups, a free radical initiator, and an sensitizing dye, and (iii) a water soluble or dispersible overcoat; wherein the weight ratio of all the monomers having at least 3 (meth)acrylate groups to all the alkaline soluble polymeric binders is at least 1.1;

(b) exposing said plate with a laser having a wavelength of from 250 to 430 nm at a dosage of less than 300 μJ/cm$^2$ according to digital imaging information to cause hardening of the photosensitive layer in the exposed areas; and (c) developing said exposed plate with an aqueous alkaline developer having a pH of from 9.0 to 13.5 (preferably 10.0 to 13.5) to remove the non-exposed areas of the photosensitive layer.

According to another aspect of the present invention, there has been provided a method of processing a lithographic printing plate comprising in order:

(a) preparing a photosensitive coating fluid comprising an alkaline soluble polymeric binder, a monomer having at least 3 (meth)acrylate groups, a free radical initiator, a sensitizing dye, a pigment, and an organic solvent by (i) providing one or more liquid pigment dispersions which together comprise all the pigment or pigments, less than half by weight of the solvent for the coating fluid, and less than half by weight of the non-volatile components of said coating fluid, (ii) dissolving at least all the polymeric binders not used in the pigment dispersion in at least a fraction of the solvent not used in the pigment dispersion to form one or more solutions, and (iii) mixing said pigment dispersion or dispersions with said solution or solutions and any remaining materials of said coating fluid; wherein the solvents in each pigment dispersion, in each solution, and in the coating fluid are the same or different, and each solvent is a single solvent compound or a mixture of two or more solvent compounds;

(b) coating said photosensitive fluid onto a substrate and drying off the solvent to form a photosensitive layer;

(c) coating a water soluble or dispersible overcoat fluid onto said photosensitive layer and drying off the water to form a water soluble or dispersible overcoat;

(d) exposing said plate with a laser having a wavelength of from 250 to 430 nm at a dosage of less than 300 μJ/cm$^2$ according to digital imaging information to cause hardening of the photosensitive layer in the exposed areas; and (e) developing said exposed plate with an aqueous alkaline developer having a pH of from 9.0 to 13.5 (preferably 10.0 to 13.5) to remove the non-hardened areas of the photosensitive layer.

According to yet another aspect of the present invention, there has been provided a method of processing a lithographic printing plate comprising in order:

(a) providing a lithographic printing plate comprising (i) a hydrophilic substrate, (ii) an oleophilic photosensitive layer comprising an alkaline soluble polymeric binder, a monomer having at least 3 (meth)acrylate groups, a free radical initiator, and an sensitizing dye, and (iii) a water soluble or dispersible overcoat;

(b) exposing said plate with a laser having a wavelength of from 250 to 430 nm at a dosage of less than 300 μJ/cm$^2$ according to digital imaging information to cause hardening of the photosensitive layer in the exposed areas; and (c) developing said exposed plate with an aqueous alkaline developer having a pH of from 9.0 to 13.5 (preferably 10.0 to 13.5) on a developing processor to remove the non-exposed areas of the photosensitive layer; wherein said developer is maintained with a developer replenisher having a pH of at least 0.2 higher than said developer by at least replacing a portion of the developer in the developing tank with said replenisher at least periodically and according to the plate throughput; and said developer comprises a first inorganic alkaline compound and said replenisher comprises a second inorganic alkaline compound, the first and the second inorganic alkaline compounds being the same or different.

DETAILED DESCRIPTION OF THE PREFERRED EMBODIMENTS

The substrate employed in the lithographic printing plates of this invention can be any support that provides a hydrophilic surface. Such a support may be a metal sheet, a polymer film, or a coated paper. Aluminum (including aluminum alloys) sheet is a preferred support. Particularly preferred is an aluminum support that has been grained and anodized, with or without further hydrophilic treatment. Surface graining can be achieved by mechanical graining or brushing, chemical etching, and/or AC electrochemical graining. Electrochemical graining or combination of mechanical graining and electrochemical graining is the preferred graining method. The grained aluminum is typically treated with a basic or acid solution to remove the smut (called desmut treatment), and then subjected to an electrochemical anodization process utilizing an acid such as sulfuric acid and/or phosphoric acid. The anodization process serves to form an anodic oxide layer and is preferably controlled to create a layer of at least 0.1 g/m$^2$, more preferably 1 to 8 g/m$^2$, and most preferably 2 to 4 g/m$^2$. The desmut is preferably controlled to achieve a reflection optical density of preferably from 0.10 to 1.0, more preferably from 0.20 to 0.70, even more preferably from 0.25 to 0.60, and most preferably from 0.30 to 0.50 for the final substrate.

The grained and anodized aluminum can be further treated with hot water (such as at 80° C. for 10 seconds) to improve the surface hydrophilicity or treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method. By thermal method, the grained and anodized aluminum passes through or is immersed for a certain time in a solution containing the hydrophilic material at preferably an elevated temperature, such as at 80° C. for 10 seconds. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205.

The relatively high reflection optical density (darker) of the aluminum substrate was found to increase the photospeed of the plate of this current invention. On the other hand, lower reflection optical density (whiter) of the substrate allows better contrast and viewing. Preferably, the substrate has higher reflection optical density (for the coated plate) and can be changed to lower optical density by the developer during the development process. Usually, plate with higher optical density or less or no desmut can change optical density by certain alkaline developers more easily. Stronger alkaline developer, more brushing on developer, higher development time, and higher developer temperature will help achieve larger reduction in the optical density of the substrate. In such a process, the reflection optical density of the substrate preferably drops at least 0.01, more preferably at least 0.02, and most preferably at least 0.04 from before development to after development.

According to the first aspect of the current invention, the photosensitive layer comprises an alkaline soluble polymeric binder, a (meth)acrylate monomer having at least 3 (meth) acrylate groups, a free radical initiator, and a sensitizing dye. A hydrogen donor is preferably added. The weight ratio of the monomers having at least 3 (meth)acrylate groups to the alkaline soluble polymeric binders is at least 1.1, preferably from 1.5 to 6.0, more preferably from 2.0 to 5.0, and most preferably from 2.5 to 4.0. The monomer preferably has at least 4 (meth)acrylate groups, more preferably at least 5 (meth)acrylate groups, and most preferably at least 6 (meth) acrylate groups. A non-alkaline soluble polymeric binder can be added, preferably at an amount less than the alkaline soluble polymeric binder. A pigment is preferably added.

According to the second aspect of the current invention, the photosensitive layer comprises a polymeric binder, a urethane (meth)acrylate monomer having at least 4 (meth)acrylate groups, a free radical initiator, and a sensitizing dye. A hydrogen donor is preferably added. The weight ratio for said urethane monomers to the polymeric binders is at least 0.9, preferably from 1.2 to 6.0, more preferably from 1.8 to 5.0, and most preferably from 2.4 to 4.0. The monomer preferably has at least 5 (meth)acrylate groups, and more preferably at least 6 (meth)acrylate groups. A non-urethane (meth)acrylate monomer can be added. The polymeric binder is preferably alkaline soluble. A pigment is preferably added.

According to the third aspect of the current invention, the photosensitive layer comprises a polymeric binder, a urethane (meth)acrylate monomer having at least 3 (preferably at least 4) (meth)acrylate groups, a non-urethane (meth)acrylate monomer having at least 3 (preferably at least 4) (meth) acrylate groups, a free radical initiator, and a sensitizing dye. A hydrogen donor is preferably added. The weight ratio of the urethane (meth)acrylate monomers to the non-urethane (meth)acrylate monomers is preferably from 0.10 to 10.0, more preferably from 0.20 to 5.0, and most preferably from 0.30 to 3.0. The weight ratio of the monomers having at least 3 (preferably at least 4) (meth)acrylate groups to the polymeric binders is at least 0.5, preferably from 1.0 to 6.0, more preferably from 1.5 to 5.0, and most preferably from 2.0 to 4.0. The urethane monomer has more preferably at least 5 (meth)acrylate groups, and most preferably at least 6 (meth) acrylate groups. A pigment is preferably added.

According to the fourth aspect of the current invention, the photosensitive layer comprises an alkaline soluble polymeric binder, a (meth)acrylate monomer having at least 3 (meth) acrylate groups, a hexaarybiimidazole compound (as initiator), and a sensitizing dye. A hydrogen donor is preferably added. The weight ratio of the monomers having at least 3 (meth)acrylate groups to the alkaline soluble polymeric binders is at least 0.9, preferably from 1.1 to 6.0, more preferably from 1.5 to 5.0, and most preferably from 2.0 to 4.0. The monomer preferably has at least 4 (meth)acrylate groups, more preferably at least 5 (meth)acrylate groups, and most preferably at least 6 (meth)acrylate groups. A non-alkaline soluble polymeric binder can be added, preferably at an amount less than the alkaline soluble polymeric binder. A pigment is preferably added.

According to the fifth aspect of the current invention, the photosensitive layer is coated form a photosensitive coating fluid comprising at least one alkaline soluble polymeric binder, at least one (meth)acrylate monomer, at least one free radical initiator, at least one sensitizing dye, at least one pigment, and an organic solvent (including a solvent mixture) by (i) providing one or more pigment dispersions which together comprise said pigment or pigments, less than half by weight of all the solvent for the coating fluid, and less than half by weight of the non-volatile components of said coating fluid, (ii) dissolving at least all the polymeric binders not used in the pigment dispersion in at least a fraction of the solvent not used in the pigment dispersion to form one or more solutions, and (iii) mixing said pigment dispersion or dispersions with said solution or solutions and any remaining materials of said coating fluid. Here the pigment dispersion or dispersions can mix with the solution or solutions and any remaining materials in any method or sequence, as long as it does not cause destabilization of the pigment dispersion; for example, the solution or solutions and any remaining materials can mix to form a solution first and then further mix with the pigment dispersion or dispersions, or the pigment dispersion or dispersions can mix with the solution or solutions first and then further mix with any remaining materials; the mixing can be performed by any method such as putting the materials together and agitating or stirring until everything is dissolved or dispersed; preferably, the solid materials are added into the solution or solvent with stirring, and the pigment dispersion is added into the solution with stirring. Preferably, all the pigment forms one pigment dispersion, and all the materials not used in the pigment dispersion forms one solution, and said pigment dispersion is mixed with said solution to form the photosensitive coating. More preferably, the pigment dispersion is added into the solution with stirring. The solvent (including mixture of solvents) can be the same or different for each pigment dispersion and for each solution. The monomer preferably has at least 3 (meth)acrylate groups, more preferably at least 4 (meth)acrylate groups, even more preferably at least 5 (meth)acrylate groups, and most preferably at least 6 (meth)acrylate groups. The weight ratio of the monomer having at least 3 (meth)acrylate groups to the alkaline soluble polymeric binder is preferably at least 0.5, more preferably at least 0.9, even more preferably at least 1.1, further more preferably at least 1.5, and most preferably at least 2.0. A hexaarylbiimidazole compound is a preferred initiator. A hydrogen donor is preferably added. A compound having a dialkylaminobenzene moiety is a particularly useful sensitizing dye. A preferred pigment is a copper phthalocyanine or its derivative. The content of the pigment is preferably 0.1to 20%, and more preferably 0.5 to 15%, and most preferably 1 to 10% by weight of said photosensitive layer.

According to the sixth aspect of the current invention, the plate is developed with an aqueous alkaline developer having a pH of from 9.0 to 13.5 on a developing processor to remove the non-exposed areas of the photosensitive layer; wherein said developer is maintained with a developer replenisher having a pH of at least 0.2 higher, preferably at least 0.4 higher and more preferably at least 0.6 higher, than said developer by at least replacing a portion of the developer in the developing tank with said replenisher at least periodically and according to the plate throughput; wherein said developer comprises a first inorganic alkaline compound and said replenisher comprises a second inorganic alkaline compound, the first and the second inorganic alkaline compounds being the same or different. The lithographic printing plate comprises (i) a hydrophilic substrate, (ii) an oleophilic photosensitive layer comprising an alkaline soluble polymeric binder, a (meth)acrylate monomer, a free radical initiator, and an sensitizing dye, and (iii) a water soluble or dispersible overcoat. The monomer preferably has at least 2 (meth)acrylate groups, more preferably at least 3 (meth)acrylate groups, even more preferably at least 4 (meth)acrylate groups, further more preferably at least 5 (meth)acrylate groups, and most preferably at least 6 (meth)acrylate groups. The weight ratio of the monomer having at least 2 (meth)acrylate groups (preferably 3 (meth)acrylate groups) to the alkaline soluble polymeric binder is preferably at least 0.5, more preferably at least 0.9, even more preferably at least 1.1, further more preferably at least 1.5, and most preferably at least 2.0. A hexaarylbiimidazole compound is a preferred initiator. A hydrogen donor is preferably added. A compound having a dialkylaminobenzene moiety is a particularly useful sensitizing dye. A non-alkaline soluble polymeric binder can be added, preferably at an amount less than the alkaline soluble polymeric binder.

In the photosensitive layers of this invention (including last six paragraphs), a preferred initiator is a hexaarylbiimidazole compound; and a preferred sensitizing dye is a dialkylaminobenzophenone compound, more preferably a 4,4'-bis(dialkylamino)benzophenone compound. Preferred hydrogen donors are 2-mercaptobenzoxazole, 2-mercaptobenzimidazole, 2-mercaptobenzothiazole, 3-mercapto-1,2,4-triazole, N-phenylglycine ethyl ester, and N-phenylglycine benzyl ester, and their derivatives. Various additives, such as surfactant, colorant (dye or pigment), exposure indicating dye (such as leuco crystal violet, leucomalachite green, azobenzene, 4-phenylazodiphenylamine, and methylene blue dyes), and free radical stabilizer (such as methoxyhydroquinone) can be added. Among the colorants, pigment is preferred over dye. The content of the pigment is preferably 0.1 to 20%, and more preferably 0.5 to 15%, and most preferably 1 to 10% by weight of said photosensitive layer. Monomers with lower (meth)acrylate functionality can be added. A non-alkaline soluble polymeric binder can be added, preferably at an amount less than the alkaline soluble polymeric binder. The polymeric binder can be free of ethylenic groups or contain ethylenic groups. The polymeric binder can contain (meth) acrylate groups, allyl groups, acetoacetate groups, or other polymerizable groups, or can be free of any of such groups. The polymeric binder (alkaline soluble or alkaline insoluble) can be a reaction product of an acetoacetylated polymer and a (meth)acrylate monomer. Furthermore, a polymer (including polymeric binder) or compound having acetoacetate groups can be added.

The pigment used in the photosensitive layer of this invention is dispersed in the photosensitive layer as fine particles. The photosensitive layer of this invention is preferably coated from a photosensitive coating fluid containing the pigment dispersed in the fluid. The photosensitive fluid comprises a polymeric binder, a (meth)acrylate monomer (preferably having at least 2 and more preferably at least 3 (meth)acrylate groups), an initiator, a sensitizing dye, a pigment, and an organic solvent. Preferably, the pigment is dispersed in a solvent with addition of a dispersing agent or polymer, before mixing with the rest of the materials for the photosensitive coating fluid. More preferably, the pigment is dispersed in a solvent with addition of a dispersing agent or polymer to form one or more pigment dispersions, at least all the polymeric binders for the photosensitive coating fluid not used in the pigment dispersion are dissolved in at least a portion of the remaining solvent for the fluid to form one or more solutions, and the pigment dispersion or dispersions are mixed with the solution or solutions and any unused materials for the fluid to form the coating fluid. Even more preferably, all the pigment forms one or more liquid pigment dispersions, all the materials not used in the pigment dispersion forms one or more solutions, and the pigment dispersions and the solutions mix to form the photosensitive coating fluid. Most preferably, all the pigment forms only one liquid pigment dispersion, all the materials not used in the pigment dispersion forms only one solution, and the pigment dispersion and the solution are mixed to form the photosensitive coating fluid. The total weight of the pigment dispersions is less than half of the total weight of the photosensitive coating fluid, more preferably less than 20%, and most preferably less than 10%. It is preferred that the pigment dispersion is added into the solution with stirring.

The liquid pigment dispersion can be prepared by any method. Preferably, it is prepared using a high speed disperser (with disk or blade), a ball mill, or a roll mill (such as three roll mill). More preferably, it is prepared by a high speed disperser or a three roll mill. During the dispersing or milling, the pigment content of the pigment dispersion is preferably at least 2%, more preferably from 4 to 50%, and most preferably from 10 to 40% by weight of the dispersion; and the solvent content of the pigment dispersion is preferably at least 30%, more preferably at least 40%, and most preferably at least 50% by weight of the dispersion.

In a preferred embodiment for the violet or ultraviolet laser sensitive lithographic plates of this invention, the photosensitive layer comprises an alkaline soluble polymeric binder, a monomer having at least 3 (meth)acrylate group, a free radical initiator, a dialkylaminobenzene compound (a compound having at least one dialkylaminobenzene moiety), a hydrogen donor, and a pigment. The monomer-to-polymer weight ratio is at least 1.1, preferably from 1.5 to 6.0, more preferably from 2.0 to 5.0, and most preferably from 2.4 to 4.0. A preferred initiator is a hexaarylbiimidazole compound. A preferred dialkylaminobenzene compound is a 4,4'-bis(dialkylamino)benzophenone compound.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole compound, a dialkylaminobenzene compound, a hydrogen donor, and a pigment. The monomer-to-polymer weight ratio is at least 0.9, preferably from 1.1 to 6.0, more preferably from 1.5 to 5.0, and most preferably from 2.0 to 4.0. A preferred dialkylaminobenzene compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzene compound, a hydrogen donor, and a pigment. The monomer-to-polymer weight ratio is at least 0.9, preferably from 1.2 to 6.0, more preferably from 1.8 to 5.0, and most preferably from 2.4 to 4.0. A hexaarylbiimidazole compound is preferred among hexaarylbiimidazole and titanocene compounds. A preferred dialkylaminobenzene compound is a 4,4'-bis(dialkylamino)benzophenone compound. A non-urethane (meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, a hydrogen donor, and a pigment. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio for said monomers to the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet further another preferred embodiment for the violet or ultraviolet laser sensitive lithographic plates of this invention, the photosensitive layer comprises an alkaline soluble polymeric binder having acetoacetate groups, a monomer having at least 3 (meth)acrylate group, a free radical initiator, a sensitizing dye, and a pigment. The weight ratio for said monomers to the polymeric binders is preferably at least 0.5, more preferably from 1.0 to 6.0, even more preferably from 1.5 to 5.0, and most preferably from 2.0 to 4.0.

The photosensitive composition as described in of U.S. patent application Ser. Nos. 11/336,132, 11/504,561, 11/595,468, and 11/638,923, the entire disclosures of which are hereby incorporated by reference, can be used for the lithographic printing plates of this instant application.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term monomer to polymer weight ratio means the weight ratio of all the specific monomers to all the polymeric binders (which are solid film-forming polymers); liquid polymer such as nonionic surfactant is not considered polymeric binder and is not included in the monomer to polymer weight ratio calculation. The term "comprises a . . . " means "comprises at least one . . . "; for example, the term "comprising a monomer" means "comprising at least one monomer." The term "a solvent" means either a substantially pure solvent (with only one solvent compound, such as acetone, plus any impurities) or a mixture of two or more substantially pure solvents (with two or more solvent compounds, such as a mixture of acetone and ethanol, plus any impurities).

Polymeric binder for the photosensitive layer of this invention can be any solid film-forming polymer. The polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Examples of suitable polymers having ethylenic groups include polymers containing (meth)acrylate groups or allyl groups. Polymers having acetoacetate groups, including, for example, the acetoacetylated polymers as described in U.S. Pat. Nos. 6,919,416 and 7,001,958, can also be used as the polymeric binder in the photosensitive layer of this invention. The alkaline soluble polymeric binder suitable for the photosensitive layer of this invention can be any polymeric binder that is soluble in an aqueous alkaline solution having a pH of from 9.0 to 13.5, preferably from 10.0 to 13.5. Preferred alkaline soluble polymeric binders are polymers with carboxylic acid groups. The acid number is preferably from 20 to 300, more preferably from 40 to 200, and most preferably from 60 to 150 mg KOH/g polymer. The acid number is defined as the amount in mg of KOH required to neutralize 1 g of the polymer. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with ethylenic groups) in this application (oligomers having ethylenic groups are also included in the definition of monomers in this application).

Suitable free-radical polymerizable monomers (including oligomers) for the instant invention include, for example, multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; multifunctional epoxylated (meth)acrylate; oligomeric amine diacrylates; and reaction products of a compound having at least one acetoacetate group and a multifunctional (meth)acrylate compound. The monomers can be urethane (meth)acrylate, or non-urethane (meth)acrylate. Combination of both urethane (meth)acrylate and non-urethane (meth)acrylate monomers can be used. The monomer for the photosensitive layer of this invention preferably has at least 3 (meth)acrylate groups, more preferably at least 4 (meth)acrylate groups, even more preferably at least 5 (meth) acrylate groups, and most preferably at least 6 (meth)acrylate groups. However, monofunctional or difunctional (meth) acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers with 3 or more (meth)acrylate groups include any non-urethane (meth)acrylate monomer with 3 or more (meth)acrylate groups, such as trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

The free-radical initiators useful in this instant invention can be any compound capable of generating free radicals to cause the polymerization of the (meth)acrylate monomer in the presence of a violet or ultraviolet laser sensitizing dye upon exposure to a violet or ultraviolet laser at a dosage of from 1 to 300 $\mu J/cm^2$. Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl) phenyliodonium hexafluoroantimonate, bis(4-t-butylphenyl) iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl) borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, and 2-(1-naphthyl)-4,5-diphenyl-1,2'-biimidazole; and titanocene compounds such as bis($\eta^9$-2,4-cyclopentadien-1-yl) bis[2,6-difluoro-3-(1H-pyrrol-1-yl)phenyl) titanium. The hexaarylbiimidazole compounds and titanocene compounds are preferred initiators, and hexaarylbiimidazole compounds are more preferred. One or more initiators can be added in a photosensitive layer. The initiator is added in the photosensitive layer preferably at 0.5 to 40% by weight of the photosensitive layer, more preferably at 2 to 30%, and most preferably at 5 to 20%.

The hexaarylbiimidazole compound is a biimidazole compound having three aryl groups on each of the two imidazole moieties. Examples of hexaarylbiimidazole compounds include 2,2'-bis(o-chlorophenyl)-4,4',5,5'-tetraphenylbiimidazole, 2,2'-bis(o-chlorophenyl)-4,4',5,5'-tetra(p-methoxyphenyl)biimidazole, 2,2'-bis(o-chlorophenyl)-4,4',5,5'-tetra (p-methylphenyl) biimidazole, 2,2'-bis(o-chlorophenyl)-4,4',5,5'-tetra(p-ethoxycarbonylphenyl)biimidazole, 2,2'-bis(o-chlorophenyl)-4,4',5,5'-tetra(p-fluorophenyl)biimidazole, 2,2'-bis(o-bromophenyl)-4,4',5,5'-tetra(p-iodophenyl)biimidazole, 2,2'-bis(o-chlorophenyl)-4,4',5,5'-tetra(p-chloronaphthyl)biimidazole, 2,2'-bis(o-chlorophenyl)-4,4',5,5'-tetra(p-chlorophenyl)biimidazole, 2,2'-bis(o-bromophenyl)-4,4',5,5'-tetra(p-chloro-p-methoxyphenyl)biimidazole, 2,2'-bis(o-chlorophenyl)-4,4',5,5'-tetra(o,p-dichlorophenyl) biimidazole, 2,2'-bis(o-chlorophenyl)-4,4',5,5'-tetra(o,p-dibromophenyl)biimidazole, 2,2'-bis(o-bromophenyl)-4,4',5,5'-tetra(o,p-dichlorophenyl)biimidazole, 2,2'-bis(o,p-dichlorophenyl)-4,4',5,5'-tetra(o,p-dichlorophenyl) biimidazole, 2,2',4-tris(2-chlorophenyl)-5-(3,4-dimethoxyphenyl)-4',5'-diphenyl biimidazole, and 2,2',4,4'-bis(2-chlorophenyl)-5,5'-bis(3,4-dimethoxyphenyl) biimidazole. Of these compounds, preferred is a hexaphenylbiimidazole compound, particularly preferred is one which has the ortho-positions of the benzene rings at the 2,2'-positions on the imidazole rings replaced with halogen, more preferred is one having benzene rings at the 4,4',5,5'-positions on the imidazole rings not replaced, replaced with halogen or replaced with alkoxycarbonyl, and most preferred is a combination of embodiments of the two hexaphenylbiimidazole compounds. A particularly useful hexaarylbiimidazole compound is 2,2'-bis(o-chlorophenyl)-4,4',5,5'-tetraphenyl-biimidazole.

Suitable titanocene compounds include titanium compounds having a dicyclopentadienyl structure and a biphenyl structure, such as dicyclopentadienyl titanium dichloride, dicyclopentadienyl titanium bisphenyl, dicyclopentadienyltitanium bis(2,4-difluorophenyl), dicyclopentadienyl titanium bis(2,6-difluorophenyl), dicyclopentadienyl titanium bis(2,4,6-trifluorophenyl), dicyclopentadienyl titanium bis(2,3,5,6-tetrafluorophenyl), dicyclopentadienyl titanium bis(2,3,4,5,6-pentafluorophenyl), di(methylcyclopentadienyl) titanium bis(2,6-difluorophenyl), di(methylcyclopentadienyl) titanium bis(2,3,4,5,6-pentafluorophenyl), and dicyclopentadienyl titanium bis[2,6-difluoro-3-(1-pyrrolyl)phenyl]. A preferred titanocene compound is one having the o-positions of the biphenyl ring replaced with a halogen atom.

Violet or ultraviolet laser sensitizing dyes useful in the photosensitive layer of this invention include any dyes capable of absorbing a violet or ultraviolet laser (about 250 to 430 nm) at a dosage of less than 300 $\mu J/cm^2$ to activate the free radical initiator to cause polymerization of the monomers. Suitable violet or ultraviolet laser sensitive dyes include, for example, cyanine dyes (including polymethine dyes); chromanone compounds such as 4-diethylaminobenzilidene chromanone; dialkylaminobenzene compounds such as ethyl 4-dimethylaminobenzoate and dialkylaminobenzene as well as any compound with a dialkylaminobenzene moiety; dialkylaminobenzophenone compounds such as 4,4'-bis (dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds (including bis(dialkylamino)benzophenone compounds) are particularly suitable for ultraviolet laser sensitive plate. Bis (dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The violet laser sensitizing dye is added in the photosensitive layer preferably at 0.1 to 20% by weight of the photosensitive layer, more preferably 0.5 to 15%, and most preferably 1 to 10%.

The photosensitive composition of the present invention preferably contains one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1to 10%, and most preferably 0.5 to 5%.

Various surfactants may be added into the photosensitive layer to, for example, improve the coatability or developability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 10% by weight of the photosensitive layer, and more preferably from 0.5 to 5%.

For plates with rough and/or porous surface capable of mechanical interlocking with a coating deposited thereon, a thin water soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 $mg/m^2$, more preferably 2 to 100 $mg/m^2$, and most preferably 4 to 40 $mg/m^2$. The substrate preferably has an average surface roughness Ra of 0.2 to 2.0 microns, and more preferably 0.4 to 1.0 microns.

The water soluble or dispersible overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.1 to 5.0 $g/m^2$, more preferably from 0.5 to 3.0 $g/m^2$, and most preferably from 1.0 to 2.0 $g/m^2$.

The aqueous alkaline developer is an aqueous solution comprising 60-99% by weight of water, and 0.02 to 30%, preferably 0.1 to 20% and more preferably 0.5 to 10%, by weight of alkaline compound and having a pH of at least 8.5, preferably from 9.0 to 13.5, more preferably from 10.0 to 13.5, and most preferably from 11.0 to 13.0. More than one alkaline compound can be used. Suitable alkaline compounds include inorganic alkaline compounds such as potassium silicate, sodium silicate, potassium hydroxide, and sodium hydroxide, and organic amine compounds such as triethylamine, diethylamine, triethanolamine, and diethanolamine. One or more surfactants (ionic or nonionic or both) are preferably added. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye or pigment, and substrate conditioner (such as gum arabic, and maltodextrin), can be added. Certain salts, such as sodium chloride, potassium phosphate and ammonium sulfite, may be added to, for example, improve the hydrophilicity of the bared substrate. One or more organic solvents, preferably water soluble organic solvents, can be added at 0.1 to 20% by weight of the developer. Preferably, no organic solvent is added.

For plate developed with a developing processor, the alkaline aqueous developer can be maintained to have the same developing strength and characteristics (for achieving the same result of the developed plate) by replenishing with the same developer or with a developer replenisher having higher pH. Preferably, the developer is replenished with a replenisher having higher pH. The replenisher preferably has a pH of at least 0.2 higher than the developer, more preferably at least 0.4 higher, and most preferably at least 0.6 higher. In addition to replacing the lost developer (in terms of volume) due to evaporation and development, it is preferred that a portion of the developer is replaced with the replenisher after certain amount of plate throughput and/or time in order to maintain the same developing strength. The developing processor can be replenished automatically or by hand, and preferably automatically. The developing processor can be programmed so that the replenisher is automatically added at certain times in a certain amount corresponding to the square footage of the plate developed, the usage time, and/or idle time of the processor; and the extra amount of the developer in the developer tank is drained off (for example, to a waster container) by overflow. Alternatively, the developing processor can be programmed so that the developer is automatically drained off at a certain amount corresponding to the square footage of plate developed, the usage time, and/or idle time of the processor; and the replenisher is automatically added to replenish the developer by filling up the developer tank on the processor, including the developer lost during development and due to evaporation. Preferably, metered amount of the replenisher is pumped into the developing tank to replace about the same amount of the developer that drains off by overflow, periodically and according to the plate throughput. The replenishing rate is preferably 10-300 $ml/m^2$ plate throughput and 2-300 ml/h for off hours and idle time, more preferably 20-200 $ml/m^2$ plate throughput and 10-150 ml/h for off hours and idle time, and most preferably 30-100 $ml/m^2$ plate throughput and 20-80 ml/h for off hours and idle time.

The developer replenisher comprises an organic or inorganic alkaline compound, preferably an inorganic alkaline compound, more preferably an alkaline metal hydroxide compound, and most preferably sodium hydroxide or potassium hydroxide. The replenisher preferably further comprises a surfactant, more preferably a nonionic surfactant. Other additives, such as defoamer, dye or pigment, stabilizer, hydrophilization agent (such as gum Arabic), salt, stabilizer, and water-soluble organic solvent can be added. Preferably, no organic solvent is added.

In a particularly useful developer-replenisher system, the developer comprises a first inorganic alkaline compound and the replenisher comprises a second inorganic alkaline compound, the first and the second inorganic alkaline compounds being the same or different; preferably, the developer comprises a first alkaline metal hydroxide compound and the replenisher comprises a second alkaline metal hydroxide compound, the first and the second alkaline metal hydroxide compounds being the same or different; more preferably, the developer comprises an alkaline metal hydroxide (including sodium hydroxide or potassium hydroxide) and the replenisher comprises sodium hydroxide or potassium hydroxide. In a preferred specific developer-replenisher system, the developer comprises a sodium silicate or potassium silicate, and the replenisher comprises a sodium hydroxide or potassium hydroxide. In a second preferred specific developer-replenisher system, both the developer and the replenisher comprise sodium hydroxide or potassium hydroxide. In a third preferred specific developer-replenisher system, both the developer and the replenisher comprise sodium hydroxide or potassium hydroxide, and both contain no more than 1.0% by weight of metal silicate, preferably no more than 0.5%, and more preferably no more than 0.2%, and most preferably no metal silicate. For developer comprising sodium hydroxide and/or potassium hydroxide, the concentration of the sodium hydroxide and potassium hydroxide is preferably from 0.02 to 2.0% by weight of the developer, more preferably from 0.04 to 1.0%, and most preferably from 0.1 to 0.5%. For replenisher comprising sodium hydroxide and/or potassium hydroxide, the concentration of the sodium hydroxide and potassium hydroxide is preferably at least 0.04% by weight of the replenisher, more preferably from 0.1 to 2.0%, and most preferably from 0.2 to 1.0%. It is noted that the concentration here is the total concentration of both sodium hydroxide and potassium hydroxide if both are present; of course, if only sodium hydroxide or potassium hydroxide is present, the concentration is for this one compound.

In a further particularly useful developer-replenisher system, the developer comprises 0.02 to 10% by weight of a first inorganic alkaline compound, 0.1 to 15% by weight of a first surfactant, and 70 to 99% by weight of water; and said replenisher comprises 0.04 to 20% by weight of a second inorganic alkaline compound, 0.1 to 15% by weight of a second surfactant, and 70 to 99% by weight of water; the first and the second inorganic alkaline compounds are the same or different, and the first and the second surfactants are the same or different. The replenisher has a pH of at least 0.2 higher than the developer, preferably at least 0.4 higher, and more preferably at least 0.6 higher. In one specific system, said first inorganic alkaline compound is sodium silicate or potassium silicate and has a concentration of 0.5 to 10% by weight of the developer, and said second inorganic alkaline compound is sodium hydroxide or potassium hydroxide and has a concentration of 0.08 to 2.0% by weight of said replenisher. In another specific system, said first inorganic alkaline compound is sodium hydroxide or potassium hydroxide and has a concentration of 0.04 to 1.0% by weight of the developer, said second inorganic alkaline compound is sodium hydroxide or potassium hydroxide and has a concentration of 0.08 to 2.0% by weight of said replenisher, and said developer has a pH of 11.0 to 13.0. Here the concentration includes both sodium silicate and potassium silicate, or both sodium hydroxide and potassium hydroxide, if both presents.

The developer in the developer tank of a developing processor is preferably maintained at a substantially constant temperature. A heater and/or chiller, preferably both a heater and a chiller, can be installed to maintain such a developer temperature. The temperature setting depends on the particular plate, developer, and processing condition. Preferably, the temperature is set at a temperature around or slightly above room temperature, more preferably between 15° C. and 40° C., and most preferably between 20° C. and 30° C. The term substantially constant temperature means the temperature is maintained within 4° C. (±4° C.) of the set temperature, preferably within 2° C. (±2° C.), and more preferably within 1° C. (±1° C.) during plate processing.

The laser-exposed plate can be directly developed with an aqueous alkaline developer. Preferably, the exposed plate can be rinsed with water to remove the overcoat without developing the photosensitive layer before development. Such a process is called pre-wash. Such a separate overcoat removal process helps reduce the contamination of the developer by the overcoat and thus prolongs the use life of the developer.

After development, the plate is preferably rinsed with water to remove the developer on the plate surface. The plate can be sprayed with water or dipped in a water tank, with or without wiping or brushing. The rinsed plate can be applied with a plate finisher (also called gum), such as gum arabic, to improve the hydrophilicity of the substrate in the background areas. The plate finisher preferably has a pH of less than 5.0, more preferably less than 4.0, and most preferably less than 3.0.

The water for rinsing the developed plate (rinsing water) is preferably fresh water (such as tap water), for the purpose of better rinsing efficiency. However, recycled rinsing water (which has been used for rinsing other developed plates) can also be used, usually with a filter to remove any solid materials. Here the term recycled rinse water means water that has been used for rinsing other developed plates or a mixture of fresh water and water that has been used for rinsing other developed plates, with or without further filtration. When recycled rinsing water or limited amount of water is used to rinse the just developed plate (with a thin layer of alkaline developer on the surface), it is preferred that an acidic plate finisher with a pH of less than 4.0 (preferably less than 3.0, and most preferably less than 2.0) is applied to the plate surface, so that the alkaline liquid on the plate surface can be neutralized without causing undesirable effect (such as alkaline etching) to the plate.

The plate just developed with an alkaline developer (with a thin layer of alkaline developer on the surface), without any or with only limited water rinse so that the plate surface remains alkaline (with a pH of at least 8.0, preferably at least 8.5, more preferably at least 9.0, and most preferably at least 9.5), can be applied with an acidic solution (including gum) having a pH of less than 4.0 (preferably less than 3.0, and most preferably less than 2.0) to neutralize the alkaline plate surface, preventing undesirable effect (such as alkaline etching) to the plate. In addition to no rinse or rinse with only limited amount of water, recycled rinse water with some alkalinity (such as with a pH of at least 8.0, at least 8.5, or at least 9.0, but at least 1.0 below the pH for the developer, preferably at least 2.0 and more preferably at least 3.0 below the pH for the developer) can also be used to rinse the plate, followed by further treating the plate with an acidic solution (including acidic gum) with a pH of less than 4.0 (preferably less than 3.0, and more preferably less than 2.0). Such processes (without any rinse, with recycled rinsing water rinse, or with only limited water rinse, followed by acid neutralization) allow the save of water in plate process, helping protect the environment. Preferably no rinse or rinse with recycled water or with limited amount of water is used in order to save water. More preferably, for pure environmental concern, no rinse is used; for both environmental concern and practical purpose, rinse with recycled rinse water or with limited amount of water (most preferably rinse with recycled water) is used. The plate coming out of the developer unit (such as the developer tank) is preferably squeezed with squeegee rollers or by other means to remove the overflowing developer and minimize the amount of developer left on the plate surface.

The laser-exposed plate can be directly developed with an aqueous alkaline developer. Preferably, the laser-exposed plate is overall heated to an elevated temperature to further harden the exposed areas before development. The preheat condition is preferably 50 to 200° C. for 1 to 600 seconds, more preferably 70 to 140° C. for 1 to 300 seconds, and most preferably 90 to 120° C. for 1 to 60 seconds. The plate can be heated by any method that does not cause hardening of the photosensitive layer in the non-exposed areas. Such a heating process is called preheat. Suitable heating methods include, for example, hot air, contacting with a heated material such as a metal board, or applying an infrared radiation. It is noted that the plate temperature usually changes dramatically during the heating process (such as in the heating oven or passing through a heating unit). For development process including a step of washing off the overcoat with water before development, it is preferred that the preheat is performed before washing off the overcoat.

The development as well as the preheat and pre-wash can be carried out by hand or on a development processor. Preferably, the development is carried out on a development processor. More preferably, all the process steps after laser exposure and before printing on press are carried out on a development processor. The development processor can perform the functions of preheat, pre-wash, development with an aqueous alkaline developer, rinse with water, gumming with a plate finisher, and drying. One or more of the steps, such as preheat or gumming, may be turned off for certain plate of this invention (depending on, for example, the specific photosensitive layer composition or substrate).

Violet or ultraviolet lasers useful for the imagewise exposure of the lithographic printing plates of this invention include any laser having a wavelength of from 250 to 430 nm. Examples of such lasers include violet laser diode of about 405 nm, ultraviolet laser diode of about 375 nm, and ultraviolet LEDs. Violet laser diode is especially useful because of its small size and relatively lower cost. Preferred ultraviolet lasers are ultraviolet laser diodes. The exposure dosage is preferably less than 300 $\mu J/cm^2$, more preferably from 1 to 200 $\mu J/cm^2$, and most preferably from 5 to 100 $\mu J/cm^2$, depending on the sensitivity of the photosensitive layer.

Any violet or ultraviolet laser imaging device can be used which provides imagewise laser exposure of 250 to 430 nm according to digital imaging information. Commonly used imaging devices include flatbed imager, internal drum imager, and external drum imager, all of which can be used for the imagewise laser exposure in this invention.

The laser exposure and development are preferably performed under a safe light which does not have radiation below a certain cutoff wavelength (such as an orange light with a cutoff wavelength of 550 nm or a yellow light with a cutoff wavelength of 450 nm), or in a light-tight box. The developed plate can be handled under any light, including white light. Alternatively, the laser exposed plate can be treated with a deactivating agent to deactivate the photosensitive layer so that the plate can be handled under white light before and during development, as described in U.S. patent application Ser. No. 11/266,817, the entire disclosure of which is hereby incorporated by reference.

The invention is further illustrated by the following non-limiting examples of its practice. Unless specified, all the values are by weight.

EXAMPLES 1-10

Ten sheets of electrochemically grained, anodized and polyvinylphosphonic acid treated aluminum substrates were coated with the photosensitive layer formulations PS-1 to PS-10 (as listed in Table 1), respectively, with a #6 Mayer rod, followed by hot air blow drying and baking in an oven at 90° C. for 2 min.

TABLE 1

(all values are by weight)

| Component | PS-1 | PS-2 | PS-3 | PS-4 | PS-5 | PS-6 | PS-7 | PS-8 | PS-9 | PS-10 |
|---|---|---|---|---|---|---|---|---|---|---|
| Carboset 527 (Alkaline soluble polymeric binder with acid No. of 80, from B. F. Goodrich) | 2.69 | 2.69 | 2.69 | 2.69 | 2.69 | 2.69 | 2.69 | 4.56 | 4.56 | 4.56 |
| Sartomer CN975 (Hexafunctional urethane acrylate monomer from Sartomer Company) | 6.43 | | | | 3.22 | 3.22 | 3.22 | 4.56 | | |
| Sartomer SR-399 (Pentafunctional non-urethane acrylate monomer from Sartomer Company) | | 6.43 | | | 3.22 | | | | 4.56 | |
| Sartomer SR-295 (Tetrafunctional non-urethane acrylate monomer from Sartomer Company) | | | 6.43 | | | 3.22 | | | | |
| Sartomer SR-349 (Difunctional non-urethane acrylate monomer from Sartomer Company) | | | | 6.43 | | | 3.22 | | | 4.56 |
| Renol Blue B2G-HW (60 parts blue pigment dispersed in 40 parts polyvinylbutyral from Ciba) | 0.57 | 0.57 | 0.57 | 0.57 | 0.57 | 0.57 | 0.57 | 0.57 | 0.57 | 0.57 |
| Pluronic L43 (Nonionic surfactant from BASF) | 0.14 | 0.14 | 0.14 | 0.14 | 0.14 | 0.14 | 0.14 | 0.14 | 0.14 | 0.14 |
| 2,2'-Bis(2-chlorophenyl)-4,4',5,5'-tetraphenyl-1,1'-biimidazole | 1.21 | 1.21 | 1.21 | 1.21 | 1.21 | 1.21 | 1.21 | 1.21 | 1.21 | 1.21 |
| 4,4'-Bis(diethylamino) benzophenone | 0.72 | 0.72 | 0.72 | 0.72 | 0.72 | 0.72 | 0.72 | 0.72 | 0.72 | 0.72 |

TABLE 1-continued (all values are by weight)

| Component | PS-1 | PS-2 | PS-3 | PS-4 | PS-5 | PS-6 | PS-7 | PS-8 | PS-9 | PS-10 |
|---|---|---|---|---|---|---|---|---|---|---|
| 2-Mercaptobenzoxazole | 0.24 | 0.24 | 0.24 | 0.24 | 0.24 | 0.24 | 0.24 | 0.24 | 0.24 | 0.24 |
| 1-Methoxy-2-propanol | 61.60 | 61.60 | 61.60 | 61.60 | 61.60 | 61.60 | 61.60 | 61.60 | 61.60 | 61.60 |
| 2-Butanone | 26.40 | 26.40 | 26.40 | 26.40 | 26.40 | 26.40 | 26.40 | 26.40 | 26.40 | 26.40 |
| Monomer to polymeric binder weight ratio | 2.20 | 2.20 | 2.20 | 2.20 | 2.20 | 2.20 | 2.20 | 0.95 | 0.95 | 0.95 |
| Multifunctional monomer to polymeric binder weight ratio | 2.20 | 2.20 | 2.20 | 0.00 | 2.20 | 2.20 | 1.10 | 0.95 | 0.95 | 0.00 |
| Multifunctional monomer to alkaline soluble polymeric binder weight ratio | 2.39 | 2.39 | 2.39 | 0.00 | 2.39 | 2.39 | 1.19 | 1.00 | 1.00 | 0.00 |

Each of the photosensitive layer coated plates was further coated with a water-soluble overcoat OC-1 using a #6 Mayer rod, followed by hot air blow drying and baking in an oven at 90° C. for 2 min. The above coating and drying were performed under red light and the plates were kept in a light-tight box before development.

OC-1

| Component | Weight ratios |
|---|---|
| Airvol 203 (Polyvinyl alcohol from Air Products) | 15.0 |
| Triton X-100 (Surfactant from Union Carbide) | 0.20 |
| Water | 85.0 |

The above coated plates (Plates #1 to #10, with PS-1 to PS-10, respectively) were exposed with a violet laser imager equipped with a 60 mw laser diode emitting at about 405 nm (MAKO 8 from ECRM) at a dosage of 65 μJ/cm². The exposed plates were developed with an alkaline aqueous developer containing 2.0% by weight of potassium silicate and 3.0% by weight of a nonionic surfactant, and rinsed with water. The laser exposure was performed under an orange light (with a cut off wavelength of 550 nm—no light below 550 nm), and the development was performed under a red light. The developed plates were evaluated for the imaging pattern and background, with the results listed in Table 2.

TABLE 2

| | Plate | | | | | | | | | |
|---|---|---|---|---|---|---|---|---|---|---|
| | #1 | #2 | #3 | #4 | #5 | #6 | #7 | #8 | #9 | #10 |
| Photosensitive layer | PS-1 | PS-2 | PS-3 | PS-4 | PS-5 | PS-6 | PS-7 | PS-8 | PS-9 | PS-10 |
| Imaging pattern | Good | Good | Good | Wash off | Good | Good | Fair | Fair | Poor | Wash off |
| Background | Clean | Clean | Clean | Clean | Clean | Clean | Clean | Clean | Clean | Clean |
| Highlight resolution | 2% | 2% | 2% | Wash off | 2% | 2% | 20% | 20% | >20% | Wash off |

EXAMPLE 11

A photosensitive layer fluid PS-11 was prepared by mixing all components in a 200 ml bottle, and continuing stirring until all materials are dissolved or dispersed. The photosensitive fluid was coated onto an electrochemically grained and anodized aluminum substrate with a #8 Meyer rod, followed by drying in an oven at 90° C. for 2 minutes.

PS-11

| Component | Weight (g) |
|---|---|
| Carboset 527 (Alkaline soluble polymeric binder with acid number of 80, from B. F. Goodrich) | 2.66 |
| Ebecryl 220 (Blend of a hexafunctional aromatic acrylate monomer and a tetrafunctional non-urethane aliphatic acrylate monomer at a weight ratio of about 0.67, from UCB Chemicals) | 4.94 |

-continued

PS-11

| Component | Weight (g) |
|---|---|
| Renol Blue B2G-HW (Blue pigment dispersed in polyvinylbutyral from Clariant) | 0.47 |
| Pluronic L43 (Nonionic surfactant from BASF) | 0.11 |
| 2,2-Bis(2-chlorophenyl)-4,4',5,5'-tetraphenyl-1,1'-biimidazole | 1.01 |
| 2-Mercaptobenzoxazole | 0.40 |
| 4,4'-Bis(diethylamino)benzophenone | 0.40 |
| Acetone | 40.00 |
| 2-methoxypropanol | 50.00 |

The photosensitive layer coated plate was further coated with a water-soluble overcoat OC-1 using a #6 Meyer rod, followed by hot air blow drying and baking in an oven at 90° C. for 2 min.

The above coated plate was exposed with a violet laser imager equipped with a laser diode emitting at about 405 nm (MAKO-4 from ECRM) at dosages of about 65 and 90 μJ/cm$^2$. The exposed plate was preheated to 105° C. for 1 minute, washed with water to remove the overcoat, developed with an alkaline aqueous developer containing potassium silicate (1.5% by weight) and surfactants, rinsed with water, gummed up with Viking Negative Plate Cleaner And Finisher (from 3M), and then printed on an AB Dick 360 lithographic press for 1000 impressions (no further printing was performed). The printed sheets showed good inking, clean background, and a resolution of 2-98% at 90 μJ/cm$^2$. The plate was tested under a red or orange room light before being developed.

EXAMPLE 12

A total of 100 g solid pigment dispersion Renol Blue B2G-HW (copper phthalocyanine dispersed in polyvinylbutyral from Clariant) was added into 900 g of 2-methoxypropanol in a 2000 ml stainless steel beaker with stirring at a medium speed (about 500 rpm) with a high speed disperser (Model EMD-100 from Fawcett Co.). The mixture was further dispersed at high speed (about 4000 rpm) for about 60 minutes to form a 10% Renol Blue B2G-HW liquid pigment dispersion.

All the materials in PS-11, except for the 0.47 g of Renol Blue B2G-HW and 4.23 g of 2-methoxypropanol, were mixed in a 200 ml bottle and were continuously stirred until all solid materials were dissolved to form a solution. Then 4.7 g of the 10% Renol Blue B2G-HW liquid pigment dispersion was slowly added into the solution with stirring to form the photosensitive coating fluid PS-12.

The photosensitive fluid PS-12 was coated onto an electrochemically grained and anodized aluminum substrate with a #8 Meyer rod, followed by drying in an oven at 90° C. for 2 minutes.

The photosensitive layer coated plate was further coated with a water-soluble overcoat OC-1 using a #6 Meyer rod, followed by hot air blow drying and baking in an oven at 90° C. for 2 min.

The above coated plate was tested with the same procedure as in EXAMPLE 11. The printed sheets gave good inking, clean background, and a resolution of 1-98% at 65 μJ/cm$^2$.

This plate showed faster photospeed than the plate of EXAMPLE 11. Since the only difference between these 2 plates are the pigments, which is added as solid dispersion in EXAMPLE 11 and as liquid dispersion in EXAMPLE 12, these results indicate that the utilization of a liquid pigment dispersion improves the photospeed of the plate.

EXAMPLE 13

A total of 100 g solid pigment dispersion Microlith Green G-K (about 45% copper tetradecachlorophthalocyanine dispersed in copolymer of vinyl chloride and vinyl acetate and epoxidized soybean oil, from Ciba-Geigy) and 5 g of Disperbyk 161 (pigment dispersant from BYK Chemie) were added into 900 g of 2-methoxypropanol acetate in a 2000 ml stainless steel beaker with stirring at a medium speed (about 500 rpm) with a high speed disperser (Model EMD-100 from Fawcett Co.). The mixture was further dispersed at high speed (about 4000 rpm) for about 60 minutes to form an about 10% Microlith Blue 4G-K liquid pigment dispersion.

All the materials in PS-13, except for the 6.39 g of the 10% Microlith Green G-K liquid pigment dispersion as prepared above, were mixed in a 200 ml bottle and were continuously stirred until all solid materials were dissolved to form a solution. Then the 6.39 g of the 10% Microlith Green G-K liquid pigment dispersion was added into the solution with stirring to form the photosensitive coating fluid PS-13.

The photosensitive coating fluid PS-13 was coated onto an electrochemically grained and anodized aluminum substrate with a #8 Meyer rod, followed by drying in an oven at 100° C. for 2 minutes.

PS-13

| Component | Weight (g) |
|---|---|
| Carboset 525 (Alkaline soluble polymeric binder with acid number of about 80, from B. F. Goodrich) | 2.46 |
| Sartomer 399 (Pentafunctional acrylate monomer from Sartomer Company) | 7.87 |
| 10% Microlith Green G-K liquid pigment dispersion in 2-methoxypropanol acetate | 6.39 |
| 2',2,4,4',5,5'-Hexa[multichloro-substituted phenyl]-1,1'-bi-1-H-imidazole | 1.84 |

-continued

PS-13

| Component | Weight (g) |
|---|---|
| 4-diethylaminobenzilidene chromanone | 0.69 |
| 2-Mercaptobenzoxazole | 0.25 |
| N-phenyl glycine | 0.18 |
| Disperbyk 161 (from BYK Chemie) | 0.07 |
| 2-methoxypropanol acetate | 64.20 |
| Methyl ethyl ketone | 16.05 |

The photosensitive layer coated plate was further coated with a water-soluble overcoat OC-1 using a #6 Meyer rod, followed by hot air blow drying and baking in an oven at 110° C. for 1 min.

The above coated plate was exposed with a violet laser imager equipped with a laser diode emitting at about 405 nm (MAKO-4 from ECRM) at dosages of about 65 and 90 μJ/cm². The exposed plate was developed with an alkaline aqueous developer containing 1.5% of potassium silicate, 3% of a nonionic surfactant and 0.1% of BYK-011 (a defoamer from BYK Chemie) in water, rinsed with water, gummed up with Viking Negative Plate Cleaner And Finisher (from 3M), and then printed on an AB Dick 360 lithographic press for 1000 impressions (no further printing was performed). The printed sheets gave good inking, clean background, and a resolution of 2-98% at 65 μJ/cm². The plate was tested under a red or orange room light before being developed.

EXAMPLE 14

All the materials in PS-14, except for the 6.63 g of the 10% Microlith Green G-K liquid pigment dispersion as prepared in Example 13, were mixed in a 200 ml bottle and were continuously stirred until all solid materials were dissolved to form a solution. Then the 6.63 g of the 10% Microlith Green G-K liquid pigment dispersion was added into the solution with stirring to form the photosensitive coating fluid PS-14.

The photosensitive coating fluid PS-14 was coated onto an electrochemically grained, anodized and polyvinyl phosphonic acid treated aluminum substrate with a #8 Meyer rod, followed by drying in an oven at 100° C. for 2 minutes.

PS-14

| Component | Weight (g) |
|---|---|
| Carboset 527 (Alkaline soluble polymeric binder with acid number of about 80, from B. F. Goodrich) | 1.87 |
| Neocryl B-728 (Alkaline insoluble polymeric binder from Zeneca) | 0.94 |
| Ebecryl 220 (Blend of a hexafunctional aromatic acrylate monomer and a tetrafunctional non-urethane aliphatic acrylate monomer at a weight ratio of about 0.67, from UCB Chemicals) | 7.91 |
| 10% Microlith Green G-K liquid pigment dispersion in 2-methoxypropanol acetate | 6.63 |
| bis($\eta^9$-2,4-cyclopentadien-1-yl) bis[2,6-difluoro-3-(1H-pyrrol-1-yl)phenyl) titanium (a titanocene compound) | 1.91 |
| 4,4'-Bis(diethylamino)benzophenone | 0.71 |
| 2-methoxypropanol acetate | 64.03 |
| 2-Butanone | 16.01 |

The photosensitive layer coated plate was further coated with a water-soluble overcoat OC-1 using a #6 Meyer rod, followed by hot air blow drying and baking in an oven at 100° C. for 2 min.

The above coated plate was exposed with a violet laser imager equipped with a laser diode emitting at about 405 nm (MAKO-4 from ECRM) at dosages of about 65 and 90 μJ/cm². The exposed plate was preheated to 105° C. for 1 minute, developed with an alkaline aqueous developer containing 1.5% of potassium silicate, 3% of a nonionic surfactant and 0.1% of BYK-011 (a defoamer from BYK Chemie) in water, rinsed with water, and then printed on an AB Dick 360 lithographic press for 1000 impressions (no further printing was performed). The printed sheets gave good inking, clean background, and a resolution of 2-98% at 90 μJ/cm².

I claim:

1. A method of processing a lithographic printing plate comprising in order:

(a) providing a lithographic printing plate comprising (i) a hydrophilic substrate, (ii) an oleophilic photosensitive layer comprising an alkaline soluble polymeric binder, a monomer having at least 3 (meth)acrylate groups, a free radical initiator, and an sensitizing dye, and (iii) a water soluble or dispersible overcoat; wherein the weight ratio of all the monomers having at least 3 (meth)acrylate groups to all the alkaline soluble polymeric binders is from 1.5 to 6.0;

(b) exposing said plate with a laser having a wavelength of from 250 to 430 nm at a dosage of less than 300 μJ/cm$^2$ according to digital imaging information to cause hardening of the photosensitive layer in the exposed areas; and (c) heating said plate to an elevated temperature of 50 to 200° C. for 1 to 600 seconds; and (d) developing said plate with an aqueous alkaline developer having a pH of from 10.0 to 13.5 to remove the non-exposed areas of the photosensitive layer.

2. The method of claim 1 wherein said monomer has at least 4 (meth)acrylate groups, and the weight ratio of all the monomers having at least 4 (meth)acrylate groups to all the alkaline soluble polymeric binders is from 1.5 to 6.0.

3. The method of claim 1 wherein said monomer has at least 5 (meth)acrylate groups, and the weight ratio of all the monomers having at least 5 (meth)acrylate groups to all the alkaline soluble polymeric binders is from 1.5 to 6.0.

4. The method of claim 1 wherein said monomer has at least 6 (meth)acrylate groups, and the weight ratio of all the monomers having at least 6 (meth)acrylate groups to all the alkaline soluble polymeric binders is from 1.5 to 6.0.

5. The method of claim 1 wherein said initiator is a hexaarylbiimidazole compound.

6. The method of claim 1 wherein said initiator is a hexaarylbiimidazole compound and said sensitizing dye is a compound having at least one dialkylaminobenzene moiety.

7. The method of claim 1 wherein said photosensitive layer further comprises an alkaline insoluble polymeric binder.

8. The method of claim 1 wherein said polymeric binder is free of (meth)acrylate or allyl groups (with double bonds).

9. The method of claim 1 wherein said polymeric binder contains (meth)acrylate or allyl groups (with double bonds).

10. The method of claim 1 wherein said polymeric binder comprises (meth)acrylate units in the main chain.

11. The method of claim 1 wherein said monomer is an aromatic urethane (meth)acrylate monomer having at least 3 (meth)acrylate groups.

12. The method of claim 1 wherein said monomer is an aliphatic urethane (meth)acrylate monomer having at least 3 (meth)acrylate groups.

13. The method of claim 1 wherein said photosensitive layer further comprises a second (meth)acrylate monomer with at least 3 (meth)acrylate groups, one of said monomers being a urethane (meth)acrylate monomer and the other being a non-urethane (meth)acrylate monomer.

14. The method of claim 1 wherein said photosensitive layer further includes a compound having a mercapto group.

15. The method of claim 1 wherein said photosensitive layer further includes an N-aryl-α-amino acid, its salt or ester.

16. The method of claim 1 wherein said photosensitive layer further includes a compound having a mercapto group, and a compound selected from the group consisting of N-aryl-α-amino acids, their salts and esters.

17. The method of claim 1 wherein said substrate is a grained and anodized aluminum sheet (with or without desmut and/or hydrophilic treatment) having a reflection optical density of from 0.30 to 0.50 (before development).

18. The method of claim 1 wherein said substrate is a grained and anodized aluminum sheet (with or without desmut and/or hydrophilic treatment), and the reflection optical density of said substrate after development is at least 0.02 lower than before development.

19. The method of claim 1 wherein said exposed plate is heated to an elevated temperature of 70 to 140° C. for 1 to 300 seconds and then washed with water to remove the overcoat before said development, and said developed plate is rinsed with water and then applied with an acidic plate finisher having a pH of from 0.5 to 4.0.

20. The method of claim 1 wherein said developed plate is rinsed with a recycled rinse water having a pH of at least 8.0 or with limited amount of water so that the rinsed plate surface contains a thin layer of alkaline solution with a pH of at least 8.5, and is further applied with an acidic aqueous solution (including an acidic plate finisher) having a pH of from 0.5 to 3.0 to at least the coated side of said plate to neutralize said alkaline solution.

21. The method of claim 1 wherein said photosensitive layer further comprises a pigment at 0.5 to 15% by weight of said photosensitive layer and is coated from a coating fluid, and said coating fluid is prepared by mixing a liquid pigment dispersion with the remaining materials for said photosensitive coating fluid; wherein said pigment dispersion comprises the pigment dispersed in at least one organic solvent and is prepared through a high speed disperser, a ball mill or a roll mill, and has a pigment content of at least 2% and a solvent content of at least 40% by weight of the pigment dispersion during the dispersing or milling process; and at least a portion of said remaining materials forms a solution before mixing with said liquid pigment dispersion.

22. The method of claim 1 wherein said exposed plate is heated to an elevated temperature of 70 to 140° C. for 1 to 300 seconds.

23. The method of claim 1 wherein said exposed plate is heated to an elevated temperature of 90 to 120° C. for 1 to 60 seconds.

24. A method of processing a lithographic printing plate comprising in order:

(a) providing a lithographic printing plate comprising (i) a hydrophilic substrate, (ii) an oleophilic photosensitive layer comprising an alkaline soluble polymeric binder, a monomer having at least 3 (meth)acrylate groups, a free radical initiator, and an sensitizing dye, and (iii) a water soluble or dispersible overcoat; wherein the weight ratio of all the monomers having at least 3 (meth)acrylate groups to all the alkaline soluble polymeric binders is from 1.5 to 6.0;

(b) exposing said plate with a laser having a wavelength of from 250 to 430 nm at a dosage of less than 300 μJ/cm$^2$ according to digital imaging information to cause hardening of the photosensitive layer in the exposed areas;

(c) heating said plate to an elevated temperature of 70 to 140° C. for 1 to 300 seconds;

(d) washing said plate with water to remove the overcoat;

(e) developing said plate with an aqueous alkaline developer having a pH of from 10.0 to 13.5 to remove the non-exposed areas of the photosensitive layer;

(f) rinsing said plate with water; and (g) applying an acidic plate finisher having a pH of from 0.5 to 4.0 to said plate.

25. The method of claim 24 wherein said monomer has at least 4 (meth)acrylate groups, and the weight ratio of all the monomers having at least 4 (meth)acrylate groups to all the alkaline soluble polymeric binders is from 1.5 to 6.0.

26. The method of claim 24 wherein said monomer has at least 5 (meth)acrylate groups, and the weight ratio of all the monomers having at least 5 (meth)acrylate groups to all the alkaline soluble polymeric hinders is from 1.5 to 6.0.

27. The method of claim 24 wherein said monomer has at least 6 (meth)acrylate groups, and the weight ratio of all the monomers having at least 6 (meth)acrylate groups to all the alkaline soluble polymeric binders is from 1.5 to 6.0.

28. The method of claim 24 wherein said initiator is a hexaarylbiimidazole compound.

29. The method of claim 24 wherein said initiator is a hexaarylbiimidazole compound and said sensitizing dye is a compound having at least one dialkylaminobenzene moiety.

30. The method of claim 24 wherein said photosensitive layer further includes a compound having a mercapto group.

31. The method of claim 24 wherein said photosensitive layer further includes an N-aryl-α-amino acid, its salt or ester.

* * * * *